United States Patent [19]
Chern et al.

[11] Patent Number: 6,150,223
[45] Date of Patent: Nov. 21, 2000

[54] METHOD FOR FORMING GATE SPACERS WITH DIFFERENT WIDTHS

[75] Inventors: Horng-Non Chern, Chia-Li Jen; Kun-Chi Lin, Hsin-Chu; Alex Hou, Kaohsiung; Chien-Hua Tsai; Tsu-An Lin, both of Tai-Chung, all of Taiwan

[73] Assignee: United Microelectronics Corp., Hsin-Chu, Taiwan

[21] Appl. No.: 09/287,881

[22] Filed: Apr. 7, 1999

[51] Int. Cl.[7] .......................... H01L 21/336; H01L 21/76; H01L 21/3205; H01L 21/4763

[52] U.S. Cl. .......................... 438/303; 438/595; 438/618; 438/639

[58] Field of Search .................................... 438/303, 595, 438/618, 639

[56] References Cited

U.S. PATENT DOCUMENTS

| | | |
|---|---|---|
| 5,683,922 | 11/1997 | Jeng et al. . |
| 5,807,779 | 9/1998 | Liaw . |
| 5,874,334 | 2/1999 | Jeng et al. . |
| 5,885,895 | 3/1999 | Liu et al. . |
| 5,899,742 | 5/1999 | Sun . |
| 5,936,279 | 9/1999 | Chuang . |

Primary Examiner—John F. Niebling
Assistant Examiner—Ron Pompey
Attorney, Agent, or Firm—Harness, Dickey & Pierce, P.L.C.

[57] ABSTRACT

A method for forming a different width of gate spacer is disclosed. The method includes firstly forming a gate oxide layer on a semiconductor substrate. A polysilicon layer, a conductive layer, a first dielectric layer are formed in order on the gate oxide layer. The first dielectric layer, the conductive layer, the polysilicon layer, and the gate oxide layer are further etched using them as the interior gate and the peripheral gate. Next, second dielectric layer, third dielectric layer, and fourth dielectric layer are formed over the interior gate and the peripheral gate, and a first photoresist layer abuts the surface of the fourth dielectric layer of the interior circuit. Moreover, etching the fourth dielectric layer of peripheral gate to form a second spacer of peripheral gate, and etching the third dielectric layer of the peripheral gate are undertaken to form a first spacer of the peripheral gate. Removing the first photoresist layer and the fourth dielectric layer of the interior circuit, a fifth dielectric layer is formed on the third dielectric layer of the interior circuit. The fourth dielectric layer and the top surface of the second dielectric layer of the peripheral circuit are removed. The fifth dielectric layer is formed on the first dielectric layer and the third peripheral of the peripheral circuit, and then the second photoresist layer on the fifth dielectric layer, wherein the third photoresist layer is patterned as a bit-line contact via of the interior circuit and the bit-line contact vias of the peripheral circuit. Finally, anisotropically etching the third photoresist layer and the fifth dielectric layer, a bit-line to the substrate contact via and a bit-line to the gate contact via are formed inside the fifth dielectric layer.

12 Claims, 6 Drawing Sheets

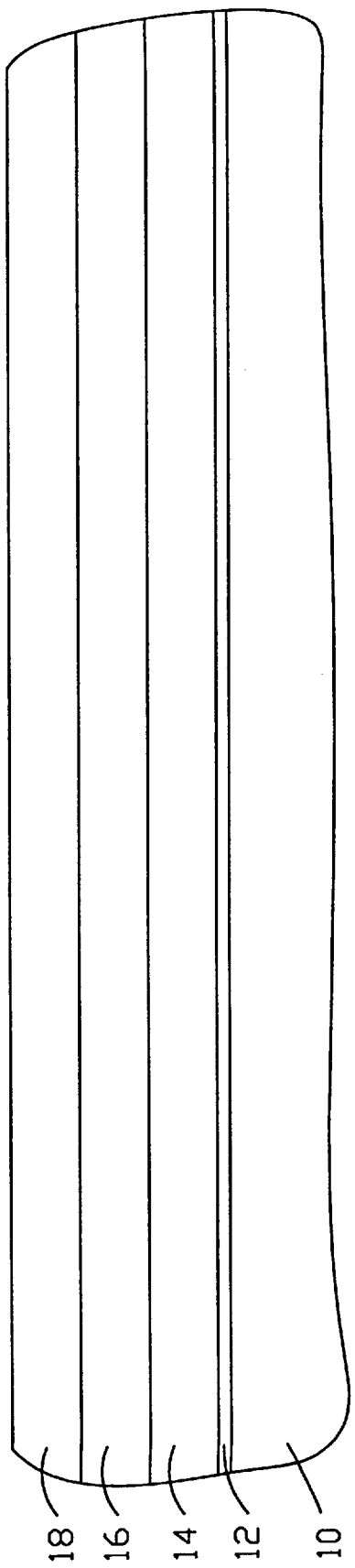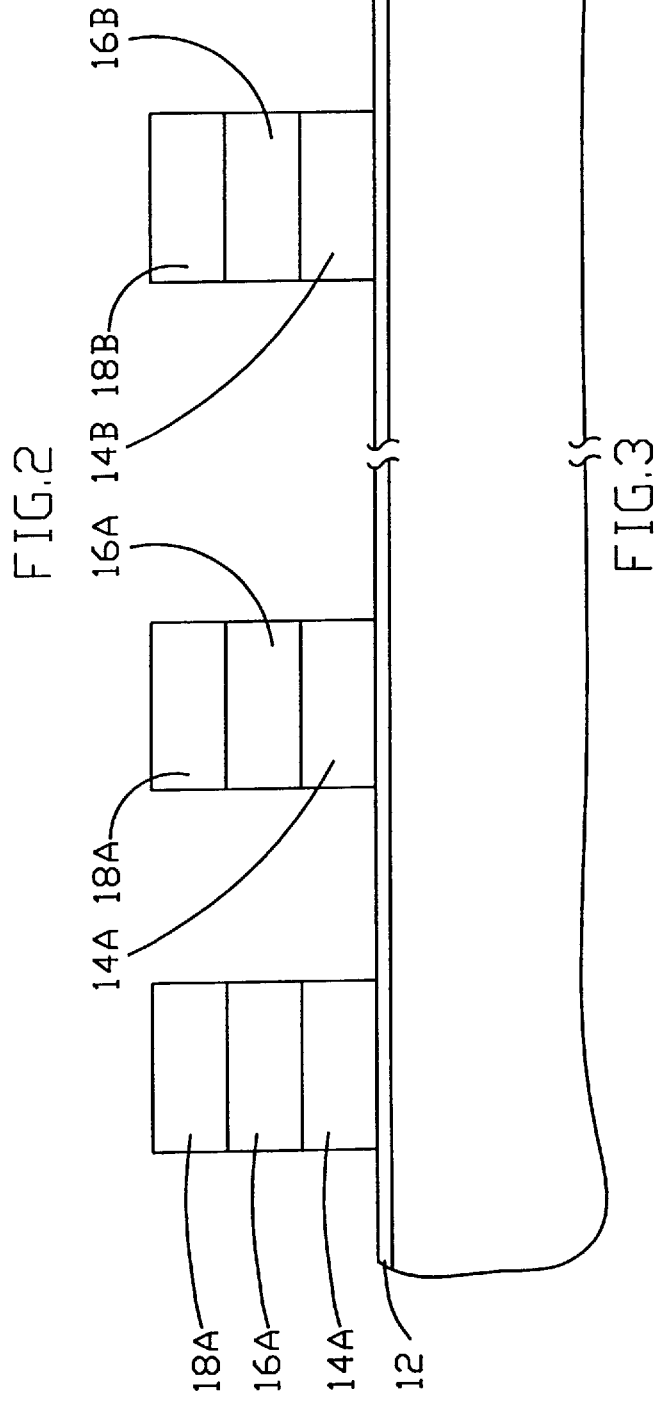
FIG.2
FIG.3

METHOD FOR FORMING GATE SPACERS WITH DIFFERENT WIDTHS

BACKGROUND OF THE INVENTION

1. Field of the Invention

The present invention relates to a method for forming a semiconductor device with a double-layer spacer. Owing to the double-layer spacer, the width of the spacers of the interior circuit and the peripheral circuit can be controlled to provide semiconductor devices of high quality.

2. Description of the Prior Art

Recently, the demand for semiconductor devices has rapidly increased owing to the widespread use of integrated electronic circuit. In particular, as an excess of than hundreds or thousands of electrical components are integrated into ICs, the need for higher quality semiconductor devices and more simplified fabrication has become imperative.

FIG. 1 shows a cross-sectional view of a traditional semiconductor device. For example, the gate substrate is usually composed of polysilicon 140A and 140B, tungsten silicide (SiW) 160A and 160B, and silicon oxide 180A and 180B. However, the gate substrate needs two steps to form a bit-line to substrate 340A and 340C contact via and a bit-line to gate contact via 340B. Further, spacers 220C and 220D are composed of silicon nitride of a traditional semiconductor device due to the structure substantially not controlling the thickness of the spacers of interior circuit and the peripheral circuit.

For the foregoing reasons, there is a need for a method of forming higher quality semiconductor devices and more simplified fabrication.

SUMMARY OF THE INVENTION

In accordance with the present invention, a method is provided for forming a double-layer spacer. Owing to the double-layer spacer, therefore substantially controlling the thickness of spacers of the interior circuit and the peripheral circuit, high quality of the semiconductor device results.

Another purpose of the present invention is to provide a method for forming gate structure composed with of polysilicon, tungsten silicide (SiW), and silicon oxide, and forming double-layer spacer, so that bit-line to substrate and bit-line to substrate contact vias are formed simultaneously.

In one embodiment, the present invention provides a method for forming a semiconductor device, which includes a double-layer spacer. A gate oxide layer is firstly applied on a semiconductor substrate, and a polysilicon layer, a conductive layer, a first dielectric layer are formed in order on the gate oxide layer. The first dielectric layer, the conductive layer, the polysilicon layer, and the gate oxide layer are further etched using them as the interior gate and the peripheral gate. Next, the second dielectric layer, the third dielectric layer, and the fourth dielectric layer are formed over the interior gate and the peripheral gate, and the first photoresist layer abuts the surface of the fourth dielectric layer of the interior circuit. Moreover, etching the fourth dielectric layer of the peripheral gate to form a second spacer of the peripheral gate, and etching the third dielectric layer of the peripheral gate to form a first spacer of the peripheral gate. Removing the first photoresist layer and the fourth dielectric layer of the interior circuit, a fifth dielectric layer is formed on the third dielectric layer of the interior circuit. The fourth dielectric layer and the top surface of the second dielectric layer of the peripheral circuit are removed. The fifth dielectric layer is formed on the first dielectric layer and on the third peripheral of the peripheral circuit, and then the second photoresist layer on the fifth dielectric layer, wherein the third photoresist layer is patterned as a bit-line contact via of the interior circuit and bit-line contact vias of the peripheral circuit. Finally, anisotropically etching the third photoresist layer and the fifth dielectric layer, a bit-line to substrate contact via and a bit-line to gate contact via are formed inside the fifth dielectric layer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIGS. 2 to 7 show cross-sectional views illustrative of various stages in the fabrication in accordance with one embodiment of the present invention.

DESCRIPTION OF THE PREFERRED EMBODIMENT

Figure 1:
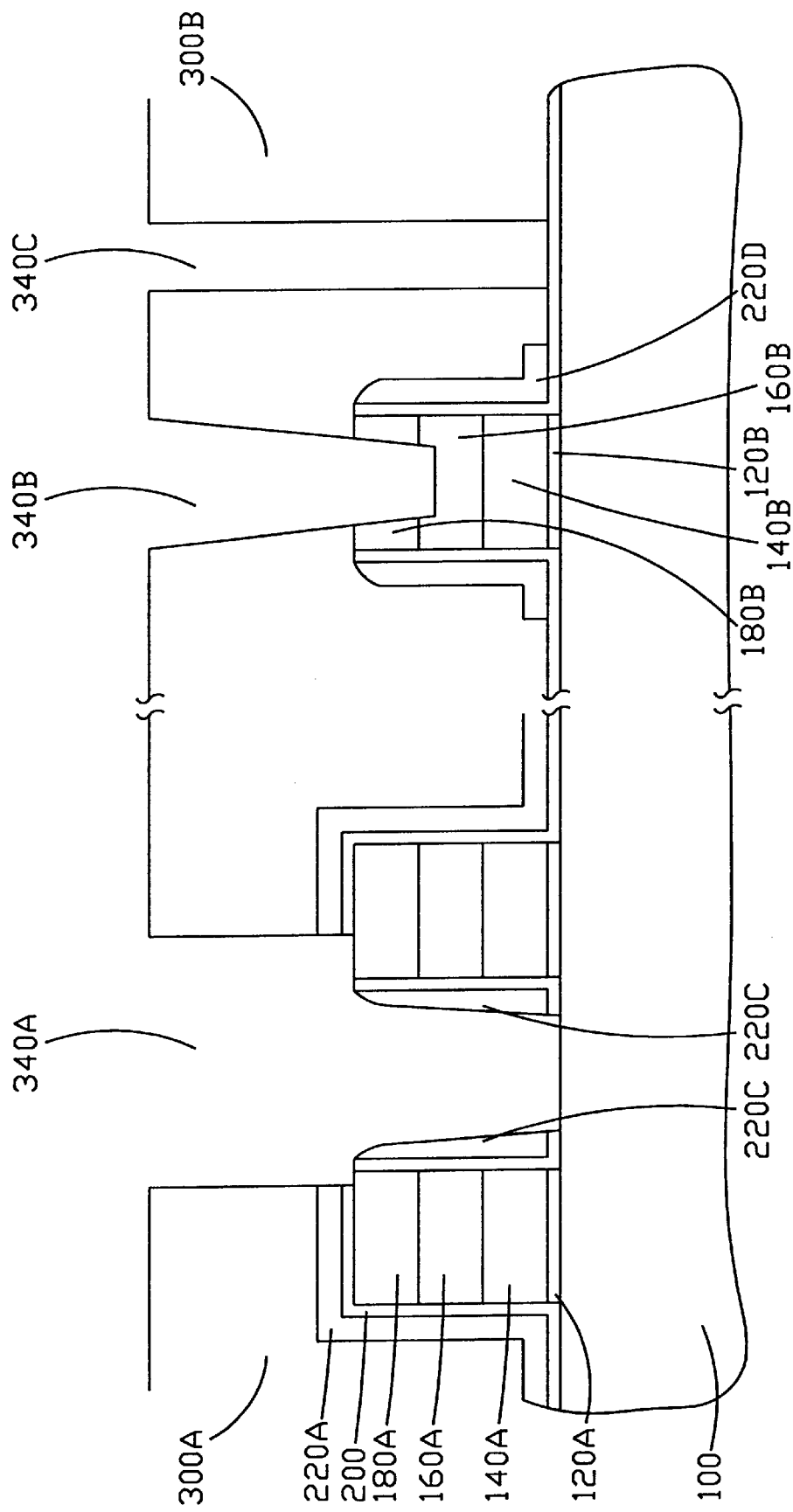
FIG. 1 shows a cross-sectional view of the fabrication of a conventional semiconductor device.

Referring to FIG. 2, a silicon substrate 10 with p type conductivity is firstly provided. It is appreciated that a semiconductor substrate with n type conductivity can also be used. However, it is appreciated that an n-type semiconductor substrate can be adapted. The substrate 10 is then placed into a furnace, and is subjected to a thermal oxidation, such as a dry oxidation process, thus forming a gate oxide layer 12 containing silicon oxide to a thickness of about 100–250 angstroms. Next, a standard low-pressure chemical vapor deposition (LPCVD) is applied to form a polysilicon layer 14 having a thickness of about 1000–3000 angstroms on the gate oxide layer 12. Generally, Arsenic or Phosphorus atoms are implanted or diffused into the polysilicon layer 14 to reduce its resistivity. Subsequently, a conventional deposition technique, such as a standard low-pressure chemical vapor deposition (LPCVD) is performed to form a conductive layer 16, such as tungsten silicide layer, on the polysilicon layer 14.

Referring to FIG. 3, a photoresist layer is then formed and patterned on tungsten silicide (SiW) layer 18 using conventional photolithography techniques, thereby defining gate areas over a portion of the substrate 10. A gate structure is formed on interior circuit and the peripheral circuit of silicon substrate 10 by anisotropical etching, for example, a conventional dry etching or reactive ion etching (RIE) technique.

Figure 4:
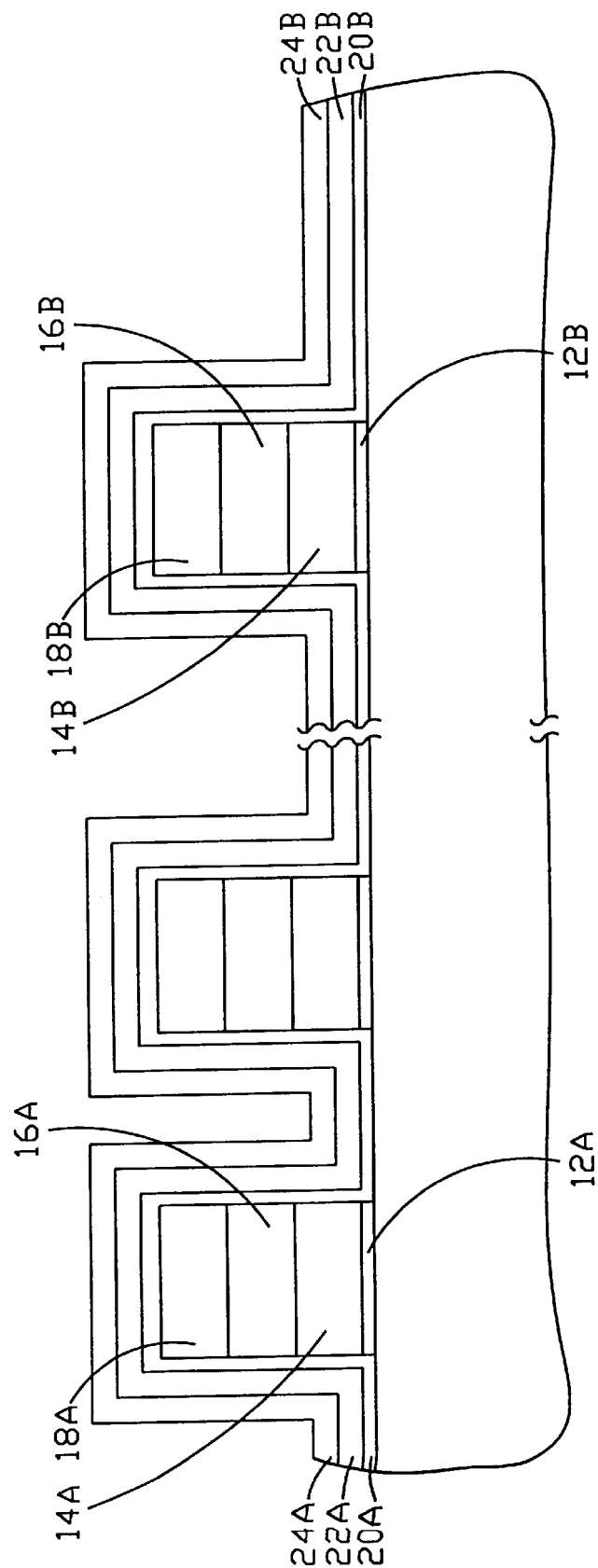

Using the gate as a doping mask, ions such as Arsenic with concentration of about $10^{13}/cm^2$ are implanted into the substrate 10, generally followed by a thermal driving and annealing in a temperature of about 900–1000° C. The cross-sectional view of FIG. 4 illustrates further steps in the formation of the tetraetheoxysilane (TEOS) 20A and 20B layer with about 200 angstroms in thickness being conformably deposited on the gate. In the embodiment, a low-pressure chemical deposition is applied. Next, a silicon nitride layer 22A and 22B and a second silicon oxide 24A and 24B are formed in order on the tetraetheoxysilane (TEOS) 20A and 20B layer by chemical vapor deposition (CVD).

Figure 5:
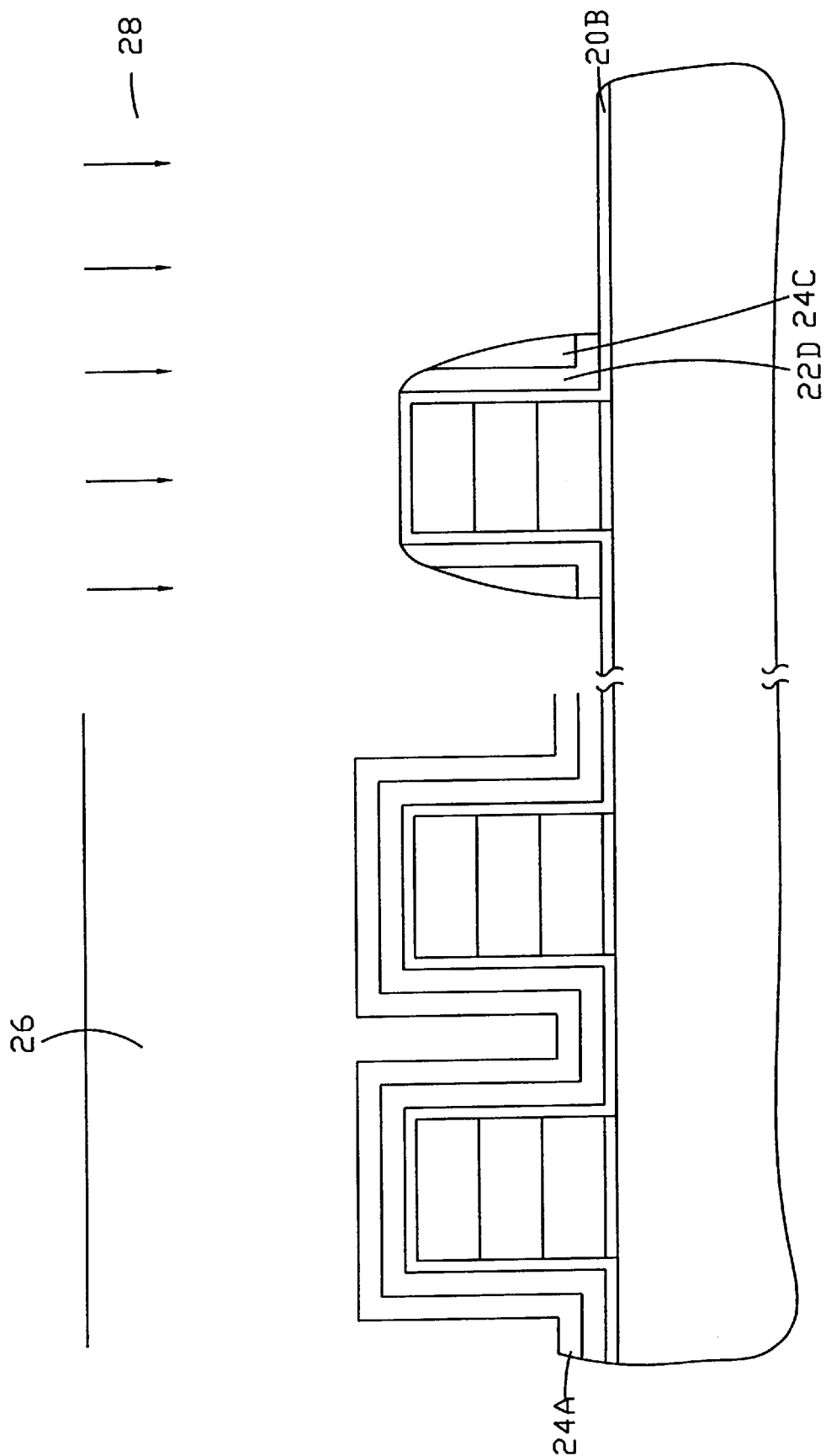

Referring to FIG. 5, a first photoresist layer 26 is deposited on the interior circuit. Subsequently, a first spacer 22D of about 600–700 angstroms and second a spacer 24C of about 500–600 angstroms are formed on the sidewalls of the gate of the peripheral circuit by self-aligning RIE method, wherein the spacers consist of silicon nitride and silicon oxide, separately.

Figure 6:
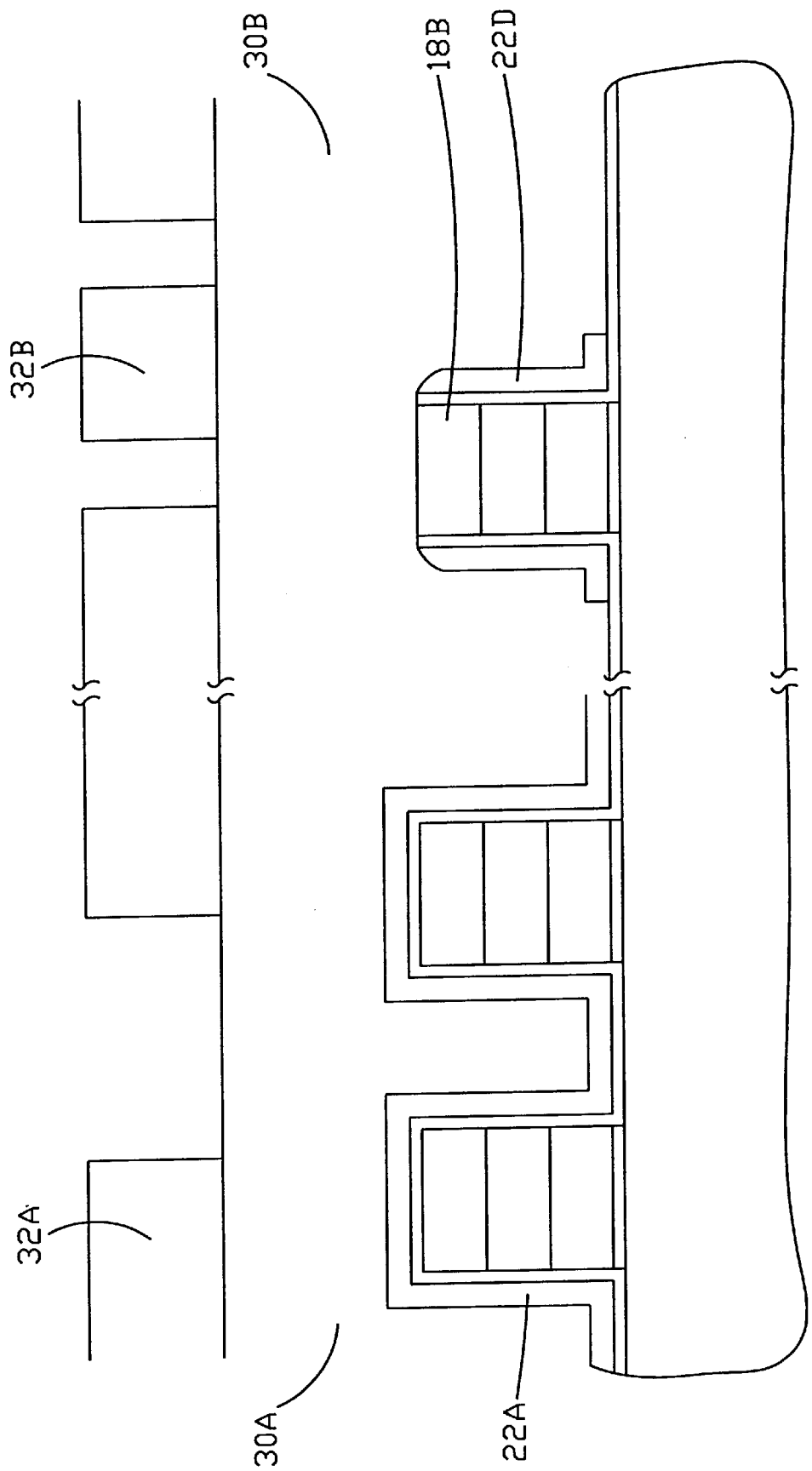

Referring to FIG. 6, the first photoresist layer 26 and the second silicon oxide of the interior circuit are removed. Subsequently, a third silicon oxide 30A and 30B is deposited over the interior circuit and the peripheral circuit. Further, a photoresist layer 32A and 32B is formed and patterned on the third silicon oxide 30A and 30B using conventional photolithography techniques, defining a bit-line to the substrate of the interior circuit, the bit-line to gate, and the bit-line to the substrate of the peripheral circuit.

Figure 7:
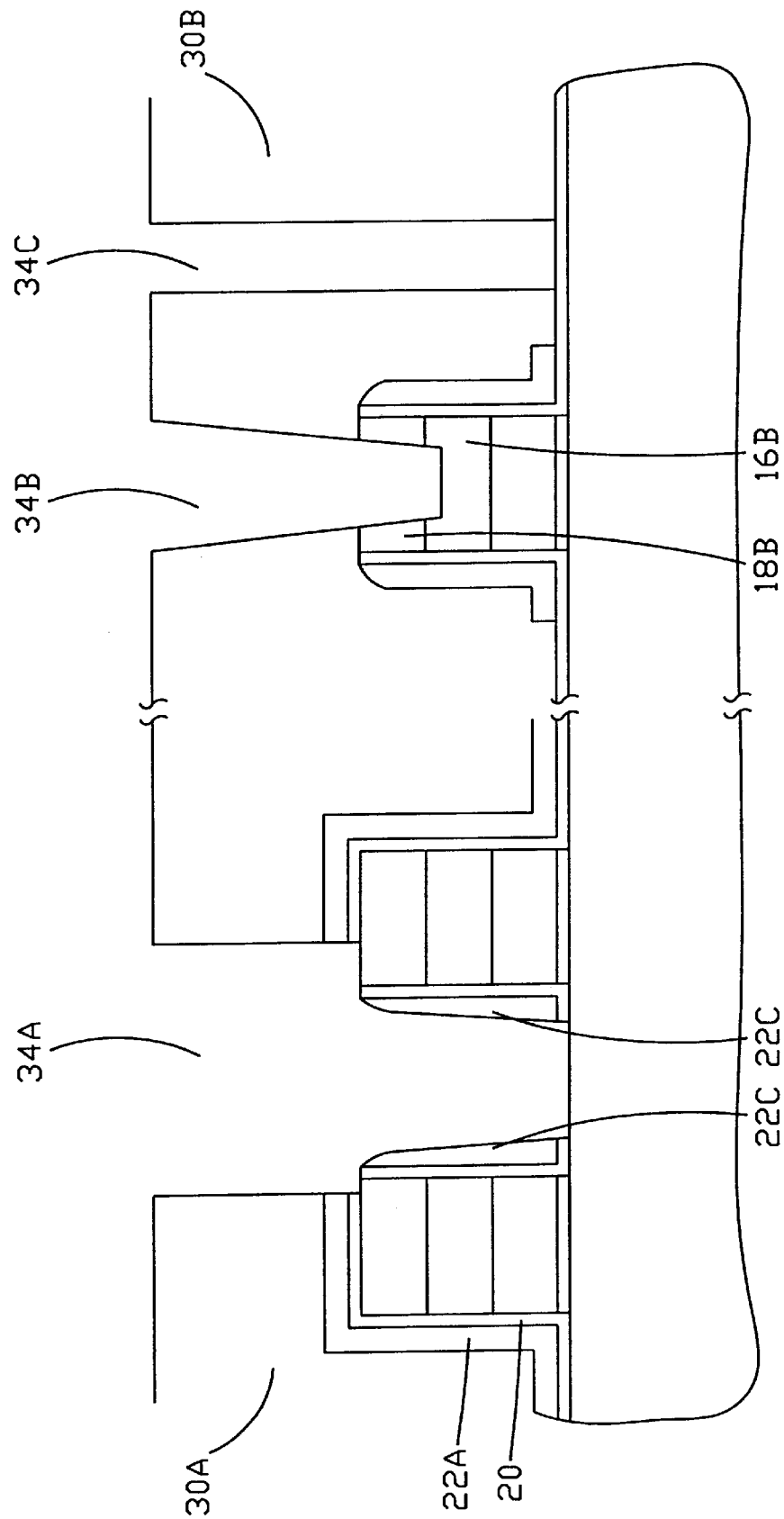

Finally, referring to FIG. 7, a standard self-aligned reactive ion etch is applied to form contact vias, such as bit-line to the substrate 34A of the interior circuit, the bit-line to gate 34B, and the bit-line to the substrate 34C of the peripheral circuit in the embodiment, in third silicon oxide layer by anisotropical etching.

Although specific embodiments have been illustrated and described, it will be obvious to those skilled in the art that various modifications may be made without departing from what is intended to be limited solely by the appended claims.

What is claimed is:

1. A method for forming a semiconductor device, said method comprising:

providing a semiconductor substrate, wherein there is a gate oxide layer formed on said semiconductor substrate;

sequentially forming a polysilicon layer, a conductive layer, and a first dielectric layer on said gate oxide layer;

patterning to etch said first dielectric layer, said conductive layer, said polysilicon layer, and said gate oxide layer to form an interior gate and a peripheral gate;

sequentially forming a second dielectric layer, a third dielectric layer, and a fourth dielectric layer over said interior gate and peripheral gate;

forming a first photoresist layer on said fourth dielectric layer of interior circuit;

etching said fourth dielectric layer of peripheral gate to form a second spacer of peripheral gate;

etching said third dielectric layer of peripheral gate to form a first spacer of peripheral gate;

removing said first photoresist layer and said fourth dielectric layer of interior circuit;

forming a fifth dielectric layer on said third dielectric layer of interior circuit;

removing said fourth dielectric layer and top surface of second dielectric layer of peripheral circuit;

forming a fifth dielectric layer on said first dielectric layer and said third dielectric of peripheral circuit;

forming a second photoresist layer on said fifth dielectric layer, wherein said second photoresist layer has a pattern of as a bit-line contact via of interior circuit and bit-line contact vias of peripheral circuit;

anisotropically etching said second photoresist layer and fifth dielectric layer of interior circuit, wherein at least two spacers and a bit-line to substrate contact via is formed between two gates of interior circuit; and anisotropically etching said second photoresist layer and fifth dielectric layer of peripheral circuit, wherein a bit-line to gate contact via is formed on upper portion of said conductive layer of peripheral circuit and a bit-line to substrate contact via.

2. The method according to claim 1, wherein said conductive layer comprises tungsten silicide.

3. The method according to claim 1, wherein said first dielectric layer comprises silicon oxide.

4. The method according to claim 1, wherein said second dielectric layer comprises tetra-ethyl-ortho-silicate (TEOS).

5. The method according to claim 1, wherein said third dielectric layer comprises silicon nitride.

6. The method according to claim 1, wherein said fourth dielectric layer comprises silicon oxide.

7. The method according to claim 1, wherein said fifth dielectric layer comprises silicon oxide.

8. A method for forming a semiconductor device, said method comprising:

providing a silicon substrate, wherein there is a gate oxide layer formed on said silicon substrate;

sequentially forming a polysilicon layer, a conductive layer, and a first silicon oxide layer on said gate oxide layer;

patterning to etch said first silicon oxide layer, said conductive layer, said polysilicon layer, and said gate oxide layer to form an interior gate and a peripheral gate;

sequentially forming a tetra-ethyl-ortho-silicate (TEOS) layer, a silicon nitride layer, and a second silicon oxide layer over said interior gate and said peripheral gate;

forming a first photoresist layer on said second silicon oxide layer of interior circuit;

etching said second silicon oxide layer of peripheral gate to form a second spacer of peripheral gate;

etching said silicon nitride layer of peripheral gate to form a first spacer of peripheral gate;

removing said second silicon oxide layer of interior circuit;

removing said second silicon oxide layer and top surface of said TEOS layer of peripheral circuit;

forming a third silicon oxide layer on said silicon substrate of interior circuit and peripheral circuit;

forming a second photoresist layer on said third silicon oxide layer, wherein said second photoresist layer has a pattern of a bit-line contact via of interior circuit and bit-line contact vias of peripheral circuit;

anisotropically etching said second photoresist layer and third silicon oxide layer of interior circuit, wherein at least two spacers and a bit-line to substrate contact via is formed between two gates of interior circuit; and anisotropically etching said second photoresist layer and third silicon oxide layer of peripheral circuit, wherein a bit-line to gate contact via is formed on upper portion of said conductive layer of peripheral circuit and a bit-line to substrate contact via.

9. The method according to claim 8, wherein said gate of peripheral circuit is formed by said polysilicon, said tungsten silicide, and silicon oxide.

10. The method according to claim 8, wherein said etching of the polysilicon layer is done by a dry etch.

11. The method according to claim 8, wherein said dry etch comprises a reactive ion etch.

12. The method according to claim 8, further forming at least three bit-line contact vias inside said third silicon oxide layer simultaneously.

* * * * *